United States Patent
He et al.

(10) Patent No.: US 12,284,798 B2
(45) Date of Patent: Apr. 22, 2025

(54) MICROELECTRONIC DEVICES INCLUDING CONTROL LOGIC CIRCUITRY OVERLYING MEMORY ARRAYS, AND RELATED MEMORY DEVICES AND ELECTRONIC SYSTEMS

(71) Applicant: Micron Technology, Inc., Boise, ID (US)

(72) Inventors: Yuan He, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 421 days.

(21) Appl. No.: 17/698,558

(22) Filed: Mar. 18, 2022

(65) Prior Publication Data
US 2023/0301053 A1  Sep. 21, 2023

(51) Int. Cl.
H10B 12/00 (2023.01)
G11C 11/408 (2006.01)
G11C 11/4091 (2006.01)

(52) U.S. Cl.
CPC .......... *H10B 12/01* (2023.02); *G11C 11/4085* (2013.01); *G11C 11/4091* (2013.01)

(58) Field of Classification Search
CPC .... H10B 12/01; H10B 12/482; H10B 12/488; H10B 12/50; G11C 11/4085; G11C 11/4091; G11C 11/4093
See application file for complete search history.

(56) References Cited

U.S. PATENT DOCUMENTS

| | | |
|---|---|---|
| 8,546,188 B2 | 10/2013 | Liu et al. |
| 2009/0168482 A1 | 7/2009 | Park et al. |
| 2019/0244933 A1 | 8/2019 | Or-Bach et al. |
| 2022/0085048 A1* | 3/2022 | Lee ............... H10B 43/40 |
| 2023/0005816 A1 | 1/2023 | Simsek-Ege |
| 2023/0005854 A1 | 1/2023 | Simsek-Ege et al. |
| 2023/0005855 A1 | 1/2023 | Simsek-Ege |
| 2023/0005902 A1 | 1/2023 | Simsek-Ege et al. |
| 2023/0005903 A1 | 1/2023 | Simsek-Ege et al. |
| 2023/0005932 A1 | 1/2023 | Simsek-Ege et al. |
| 2023/0005933 A1 | 1/2023 | Simsek-Ege |
| 2023/0060512 A1 | 3/2023 | Simsek-Ege |
| 2024/0081049 A1* | 3/2024 | Simsek-Ege ........ G11C 5/025 |

\* cited by examiner

*Primary Examiner* — Allison Bernstein
(74) *Attorney, Agent, or Firm* — TraskBritt

(57) ABSTRACT

A microelectronic device is disclosed that includes array regions individually comprising memory cells comprising access devices and storage node devices; digit lines coupled to the access devices and extending in a first direction; and word lines coupled to the access devices and extending in a second direction orthogonal to the first direction, and the word lines extend into word line exit regions. The word line exit regions are horizontally alternating with the array regions in the second direction; and sub word line driver sections are overlapping and above, and in electrical communication with the word line exit regions. Electrical communication between word lines in the word line exit regions and the sub word line driver sections vertically coupled with a vertical word line contact and other interconnections is laterally bounded within socket regions delineated by horizontal boundaries of the word line exit regions.

25 Claims, 5 Drawing Sheets

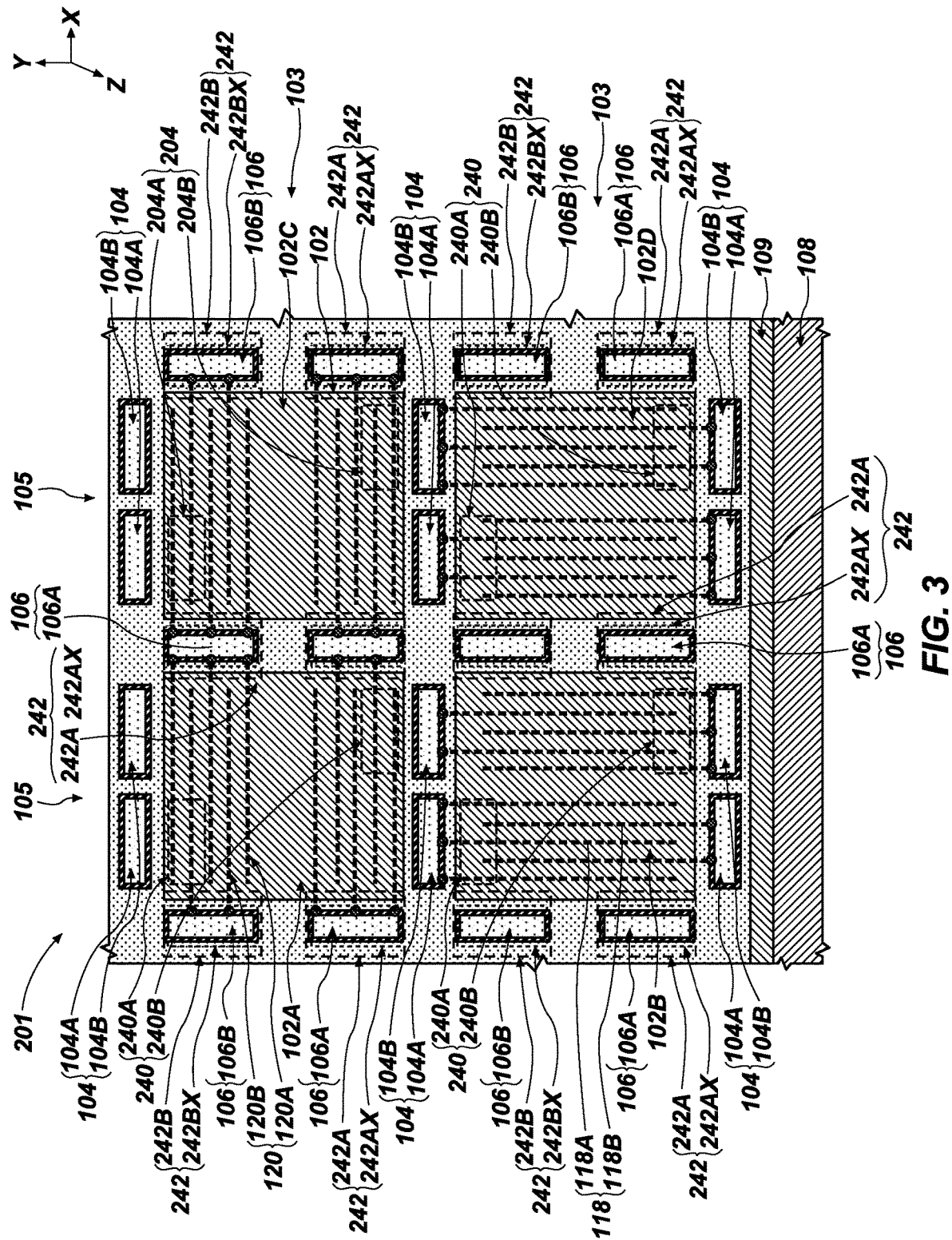

MICROELECTRONIC DEVICES INCLUDING CONTROL LOGIC CIRCUITRY OVERLYING MEMORY ARRAYS, AND RELATED MEMORY DEVICES AND ELECTRONIC SYSTEMS

TECHNICAL FIELD

The disclosure, in various embodiments, relates generally to the field of microelectronic device design. More specifically, the disclosure relates microelectronic devices including control logic circuitry overlying memory arrays, and to related memory devices, and electronic systems.

BACKGROUND

Microelectronic devices often have complex signal routing that may affect performance. One example of a microelectronic device is a memory device. Memory devices are generally provided as internal integrated circuits in computers or other electronic devices. There are many types of memory devices including, but not limited to, volatile memory devices. One type of volatile memory device is a dynamic random-access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of structures (e.g., vertical routing structures, such as conductive contacts; horizontal routing structures). Unfortunately, three-dimensional (3D) memory device (e.g., 3D DRAM device) architectures can require complex and congested routing designs to electrically connect DRAM cells to control logic circuitry, such as sub word line drivers (SWD) circuitry and sense amplifiers (SA) circuitry.

BRIEF DESCRIPTION OF THE DRAWINGS

FIG. 3 is a simplified plan view of a microelectronic device, in accordance with an embodiment of the disclosure.

DETAILED DESCRIPTION

Figure 1:
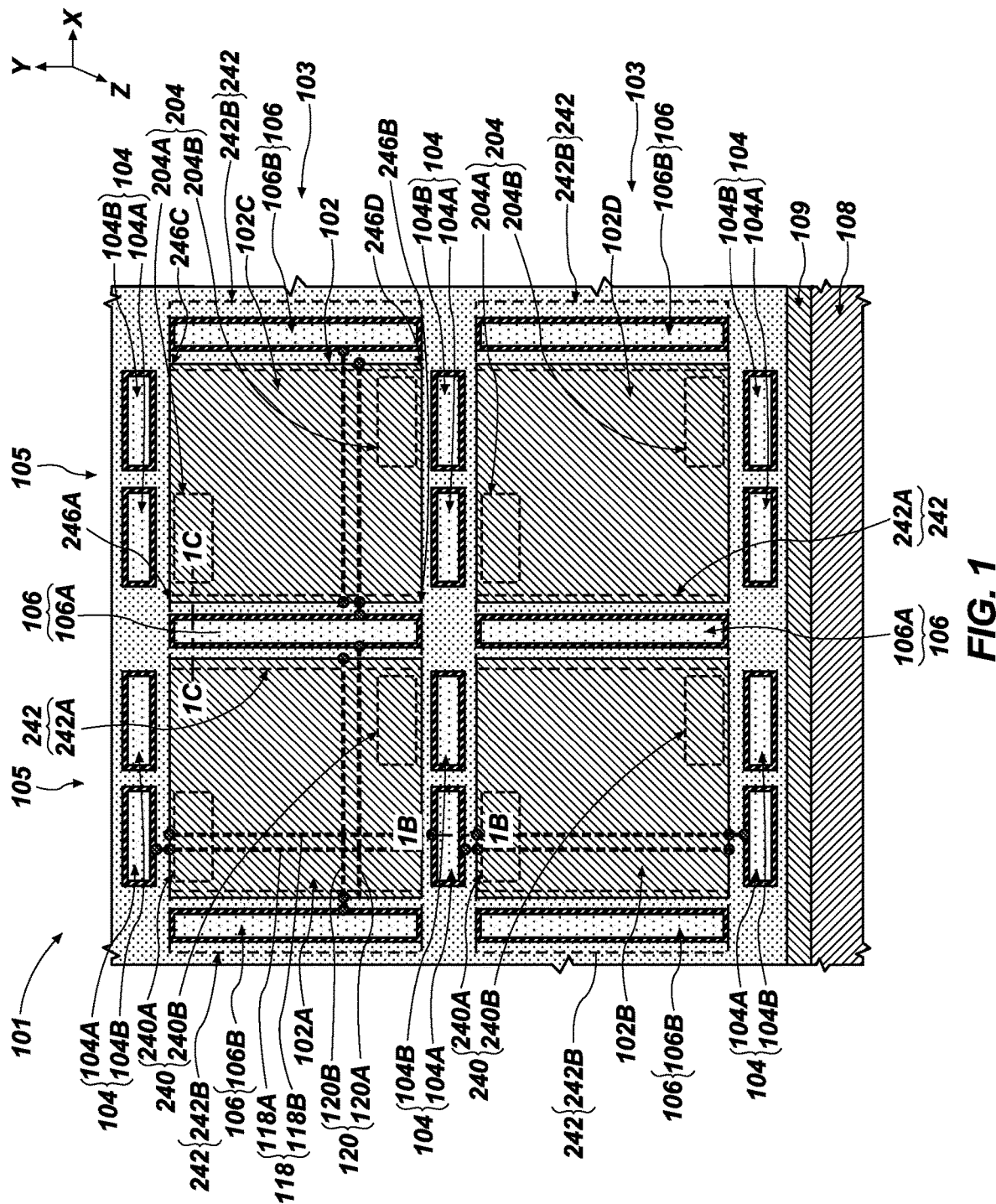
FIG. 1 is a simplified plan view of a microelectronic device, in accordance with an embodiment of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round or curved may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z"

(if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about 10-8 Siemens per centimeter (S/cm) and about 104 S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated device" where distinct integrated-circuit components are associated to produce the higher function such as that performed by an SoC, including a processor alone, a memory alone, a processor and a memory, or an integrated-circuit device including logic and memory.

As used herein, the term "substrate" means and includes a material (e.g., a base material) or construction upon which additional materials are formed. The substrate may be a semiconductor substrate. The substrate may be a base semiconductor material on a supporting structure, a metal electrode, or a semiconductor substrate having one or more materials, layers, structures, or regions formed thereon. The materials on the semiconductor substrate may include, but are not limited to, one or more of semiconductor materials, insulating materials, and conductive materials. The substrate may be a conventional silicon substrate or other bulk substrate comprising a layer of semiconductor material. As used herein, the term "bulk substrate" means and includes not only silicon wafers, but also silicon-on-insulator ("SOI") substrates. The "bulk substrate" may be a SOI substrate such as a silicon-on-sapphire ("SOS") substrate. The "bulk substrate" may be a SOI substrate such as a silicon-on-glass ("SOG") substrate. The "bulk substrate" may include epitaxial layers of silicon on a base semiconductor foundation. The "bulk substrate" may include other semiconductor and/or optoelectronic materials. The semiconductor and/or optoelectronic materials may, for example, include one or more of silicon-germanium containing materials, germanium-containing materials, silicon-carbide containing materials, gallium arsenide-containing materials, gallium nitride-containing materials, and indium phosphide-containing materials. The substrate may be doped or undoped.

As used herein, the term "mounting substrate" means and includes structures that are configured to accept an integrated-circuit device. The mounting substrate may be a silicon bridge that is configured to connect more than one integrated-circuit device. The mounting substrate may be a package board that directly contacts an integrated circuit device such as a bare die containing a central-processing unit. The package board may be mounted on a printed wiring board (PWB). The mounting substrate may be a printed wiring board onto which at least one integrated circuit device and/or package board are mounted. The mounting substrate may include a disaggregated device.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figures 2A, 2B, 2C:
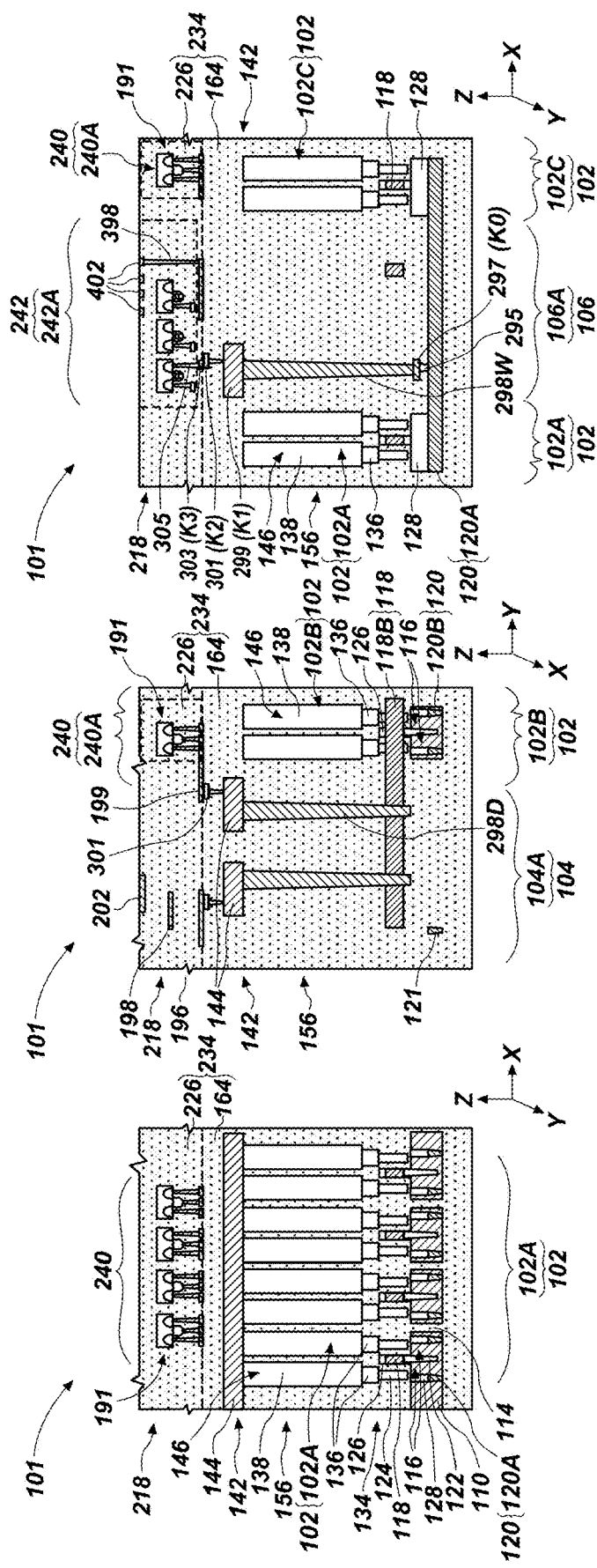
FIG. 2A is a simplified, partial longitudinal cross-sectional view of an array region of the microelectronic device depicted in FIG. 1.
FIG. 2B is a simplified, partial longitudinal cross-sectional view of a digit line exit region of the microelectronic device depicted in FIG. 1.
FIG. 2C is a simplified, partial longitudinal cross-sectional view of a word line exit region of the microelectronic device depicted in FIG. 1.
Figure 2D:
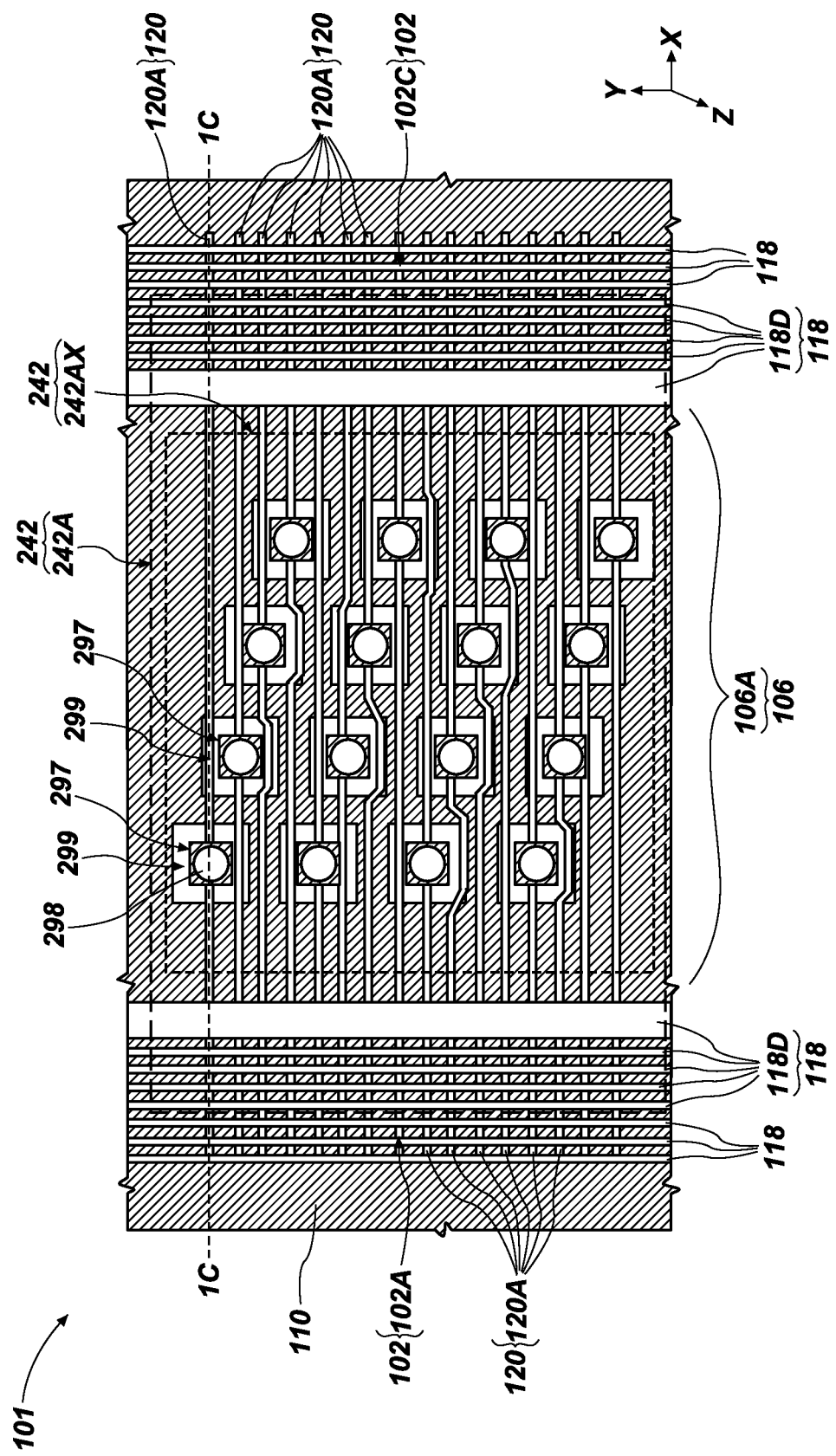
FIG. 2D is a simplified plan view of a sub word line driver (SWD) section of the microelectronic device depicted in FIG. 1.

FIG. 1 is a simplified plan view of a microelectronic device 101 (e.g., a memory device, such as a 3D DRAM device), in accordance with embodiments of the disclosure. FIGS. 2A through 2C are simplified, partial longitudinal cross-sectional views of different portions of the microelectronic device 101 depicted in FIG. 1. FIG. 2A is a simplified, partial longitudinal cross-sectional view, in an XZ-plane, of an array region 102 of the microelectronic device 101. FIG. 2B is a simplified, partial longitudinal cross-sectional view, in a YZ-plane, of a digit line exit region 104 of the microelectronic device 101. FIG. 2C is a simplified, partial longitudinal cross-sectional view, in an XZ-plane, of a word line exit region 106 of the microelectronic device 101. FIG. 2D is a simplified plan view of a portion of the microelectronic device 101 including an SWD section 242.

Referring collectively to FIGS. 2A through 2C, the microelectronic device 101 includes a first microelectronic device structure assembly 156 oriented relative to a second microelectronic device structure assembly 218 (e.g., FIGS. 2A, 2B and 2C) in a face-to-face (F2F) configuration. The first microelectronic device structure assembly 156 may be a memory device structure (e.g., a memory array wafer). The second microelectronic device structure assembly 218 may be complementary metal oxide semiconductor (CMOS) device structure (e.g., a CMOS wafer). The second microelectronic device structure assembly 218 may include sub word line driver (SWD) sections 242, sense amplifier (SA) sections 240, and control logic devices 191. Hereinafter, the first microelectronic device structure assembly 156 may also be referred to as memory array structure 156, and the second microelectronic device structure assembly 218 may also be referred to as a CMOS device structure 218.

Referring to FIG. 1, the microelectronic device 101 includes array regions 102, digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The microelectronic device 101 may also include control logic regions 109, as well as routing arrangements to different control logic devices (e.g., corresponding to the control logic devices 191 (e.g., FIGS. 2A, 2B and 2C)) within the different control logic sections, in accordance with embodiments of the disclosure. The array regions 102, the digit line exit regions 104, the word line exit regions 106, the socket regions 108, and the control logic regions 109, are each described in further detail below.

The array regions 102 of the microelectronic device 101 may comprise horizontal areas of the microelectronic device 101 configured and positioned to have arrays of memory cells (e.g., arrays of DRAM cells) within horizontal boundaries thereof, as described in further detail below. In addition, the array regions 102 may also be configured and positioned to have desirable arrangements of control logic devices within horizontal boundaries thereof, as also described in further detail below. The control logic devices are within the horizontal boundaries of the array regions 102 and may be vertically offset (e.g., in the Z-direction) from the memory cells within the horizontal boundaries of the array regions 102.

The microelectronic device 101 may include a desired quantity of the array regions 102. For clarity and ease of understanding of the drawings and related description, FIG. 1 depicts the microelectronic device 101 to include four (4) array regions 102: a first array region 102A, a second array region 102B, a third array region 102C, and a fourth array region 102D. The array regions 102 include DRAM array devices as set forth herein. As shown in FIG. 1, the second array region 102B may horizontally neighbor the first array region 102A in the Y-direction, and may horizontally neighbor the fourth array region 102D in the X-direction; the third array region 102C may horizontally neighbor the first array region 102A in the X-direction, and may horizontally neighbor the fourth array region 102D in the Y-direction; and the fourth array region 102D may horizontally neighbor the third array region 102C in the Y-direction, and may horizontally neighboring the second array region 102B in the X-direction. In additional embodiments, the microelectronic device 101 includes a different number of array regions 102. For example, the microelectronic device 101 may include greater than four (4) array regions 102, such as greater than or equal to eight (8) array regions 102, greater than or equal to sixteen (16) array regions 102, greater than or equal to thirty-two (32) array regions 102, greater than or equal to sixty-four (64) array regions 102, greater than or equal to one hundred twenty eight (128) array regions 102, greater than or equal to two hundred fifty six (256) array regions 102, greater than or equal to five hundred twelve (512) array regions 102, or greater than or equal to one thousand twenty-four (1024) array regions 102.

In addition, the microelectronic device 101 may include a desired distribution of the array regions 102. As shown in FIG. 1, in some embodiments, the microelectronic device 101 includes rows 103 of the array regions 102 extending in the X-direction, and columns 105 of the array regions 102 extending in the Y-direction. The rows 103 of the array regions 102 may, for example, include a first row including the first array region 102A and the third array region 102C, and a second row including the second array region 102B and the fourth array region 102D. The columns 105 of the array regions 102 may, for example, include a first column including the first array region 102A and the second array region 102B, and a second column including the third array region 102C and the fourth array region 102D.

With continued reference to FIG. 1, the digit line exit regions 104 of the microelectronic device 101 may comprise horizontal areas of the microelectronic device 101 configured and positioned to have at least some digit lines 118 (e.g., bit lines, data lines) horizontally terminate therein. The digit lines 118 extend across and below the array regions 102 in a first direction (Y-direction).

For an individual digit line exit region 104, at least some digit lines 118 operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures with the horizontal boundaries thereof that are operatively associated with at least some of the digit lines 118. As described in further detail below, some of the contact structures within the digit line exit regions 104 may couple the digit lines 118 to control logic circuitry of control logic devices (e.g., sense amplifier (SA) devices) that are above the array regions 102 in the CMOS device structure 218. As shown in FIG. 1, in some embodiments, the digit line exit regions 104 horizontally extend in the X-direction, and are horizontally interposed between horizontally neighboring rows 103 of the array regions 102 in the Y-direction. The digit line exit regions 104 may, for example, horizontally alternate with the rows of the array regions 102 in the Y-direction.

An individual digit line exit region 104 may be divided into multiple subregions. For example, as shown in FIG. 1, an individual digit line exit region 104 may include first digit line exit subregions 104A and second digit line exit subregions 104B. In some embodiments, the first digit line exit subregions 104A horizontally alternate with the second digit line exit subregions 104B in the X-direction. A pair (e.g., two (2)) of horizontally neighboring array regions 102 within an individual column of the array regions 102 may include one (1) of the first digit line exit subregions 104A and one (1) of the second digit line exit subregions 104B positioned horizontally therebetween in the Y-direction. By way of non-limiting example, the first array region 102A and the second array region 102B of a first column 105 of the array regions 102 may include one (1) of the first digit line exit subregions 104A and one (1) of the second digit line exit subregions 104B positioned therebetween in the Y-direction. The one (1) of the first digit line exit subregions 104A and the one (1) of the second digit line exit subregions 104B may be at least partially (e.g., substantially) confined with horizontal boundaries in the X-direction of the first array region 102A and the second array region 102B.

As described in further detail below, an individual first digit line exit subregion 104A may be configured and positioned to facilitate electrical connections between a group of digit lines (e.g., odd digit lines 118A or even digit lines 118B) and a group of control logic devices (e.g., odd SA devices or even SA devices) operatively associated with a portion (e.g., a half portion in the X-direction) of one (1) array region 102 (e.g., the first array region 102A) of a pair of horizontally neighboring array regions 102, and to also facilitate electrical connections between a group of additional digit lines (e.g., additional odd digit lines 118A or additional even digit lines 118B) and a group of additional control logic devices (e.g., additional odd SA devices or additional even SA devices) operatively associated with a corresponding portion (e.g., a corresponding half portion in the X-direction) of an additional array region 102 (e.g., the second array region 102B) of the pair of horizontally neighboring array regions 102. In addition, as also described in further detail below, an individual second digit line exit subregion 104B may be configured and positioned to facilitate electrical connections between a group of further digit lines 118 and a group of further control logic devices operatively associated with another portion (e.g., another half portion in the X-direction) of the one (1) array region 102 (e.g., the first array region 102A), and to also facilitate electrical connections between a group of yet further digit lines 118 and a group of yet further control logic devices operatively associated with a corresponding another portion (e.g., a corresponding another half portion in the X-direction) of the additional array region 102 (e.g., the second array region 102B).

Still referring to FIG. 1, the word line exit regions 106 of the microelectronic device 101 may comprise horizontal areas of the microelectronic device 101 configured and positioned to have at least some word lines 120 (e.g., access lines) horizontally terminate therein. The word lines 120 extend below the array regions 102 in a second direction (X-direction). For an individual word line exit region 106, at least some word lines 120 operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the word lines 120. As described in further detail below, some of the contact structures within the word line exit regions 106 may couple the word lines 120 to control logic circuitry of additional control logic devices (e.g., sub-word line driver (SWD) devices) that are positioned in the CMOS device structure 218 (e.g., FIGS. 2A, 2B and 2C) and vertically above and at least partially within horizontal areas of the word line exit regions 106. As shown in FIG. 1, in some embodiments, the word line exit regions 106 horizontally extend in the Y-direction, and are horizontally interposed between horizontally neighboring columns 105 of the array regions 102 in the X-direction. The word line exit regions 106 may, for example, horizontally alternate with the columns 105 of the array regions 102 in the X-direction.

With continued reference to FIG. 1, the socket regions 108 of the microelectronic device 101 may comprise horizontal areas of the microelectronic device 101 configured and positioned to facilitate electrical connections (e.g., by way of contact structures and routing structures formed within horizontal boundaries thereof) between control logic circuitry region 109 and additional structures (e.g., back-end-of-line (BEOL) structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the microelectronic device 101 to include one (1) socket region 108 horizontally neighboring a shared horizontal boundary of a control logic circuitry region 109, which is horizontally neighboring a shared horizontal boundary of the second array region 102B and the fourth array region 102D. However, the microelectronic device 101 may be formed to include one or more of a different quantity and a different horizontal position of socket region(s) 108 and control logic region(s) 109. As a non-limiting example, the socket region 108 may horizontally neighbor a shared horizontal boundary of a different group of the array regions 102 (e.g., a shared horizontal boundary of the third array region 102C and the fourth array region 102D, a shared horizontal boundary of the first array region 102A and the third array region 102C, a shared horizontal boundary of the first array region 102A and the second array region 102B). As another non-limiting example, the microelectronic device 101 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

Referring collectively to FIGS. 1 and 2A through 2C, the second microelectronic device structure assembly 218 (e.g., CMOS device structure, CMOS device wafer) includes SWD sections 242, SA sections 240, and additional control logic devices 191 (e.g., FIGS. 2A, 2B and 2C). By locating the SWD sections 242 in the CMOS device structure 218, over at least the sub word line socket areas delineated by the sub word line exit regions 106, more space above the array region 102 is made available for other circuitry. Consequently, locating the SWD sections 242 vertically above and at least partially (e.g., substantially) with horizontal areas of the word line exit regions, allows for rearranging the positions of various other control logic devices (e.g., sense amplifier devices, main word line driver (MWD) driver devices, column decoder devices) within a horizontal area of the array region 102, as desired. By way of non-limiting example, locating the SWD sections 242 vertically above and at least partially (e.g., substantially) with horizontal boundaries of the word line exit regions 106 may facilitate relatively more centralized positions of the SA sections 204 within the array region 102. Additionally, timing delays exhibited in a microelectronic device such as the microelectronic device 101, may be shortened relative to conventional configuration. For example, during use and operation, the microelectronic device 101 may have improved row-address-to-column address (tRCD) timing relative to conventional configurations. The positions of the SWD sections 242 may enhance the routing efficiency and the overall horizontal area efficiency of the microelectronic device 101.

Referring again to FIG. 1, the array regions 102 of the microelectronic device 101 are configured and positioned to have arrays of memory cells (e.g., arrays of DRAM cells) positioned within horizontal boundaries thereof, as described in further detail below. In addition, the array regions 102 (e.g., a first array region 102A, a second array region 102B, a third array region 102C and a fourth array region 102D) may also be configured and positioned to have desirable arrangements of control logic devices 191 (FIGS. 2A, 2B and 2C) that are positioned within horizontal boundaries thereof, as also described in further detail below. Some of the control logic devices 191 (FIGS. 2A, 2B and 2C) to be positioned vertically above and at least partially within horizontal areas of the array regions 102. The control logic devices 191 may be vertically offset (e.g., vertically overlie, in the Z-direction) from the memory cells.

Referring collectively to FIGS. 1 and 2A through 2C, the first microelectronic device structure assembly 156 includes arrays of memory cells 146 positioned within horizontal areas of the array regions 102 of the microelectronic device 101. At least some of the different control logic devices 191 of the second microelectronic device structure assembly 218 may be coupled to the memory cells 146 of the first microelectronic device structure assembly 156. For clarity and ease of understanding the description, not all features (e.g., structures, materials, regions, devices) of the microelectronic device 101 described below with reference to FIGS. 2A, 2B and 2C are illustrated in FIG. 1.

As shown in FIG. 1, within horizontal boundaries of the array regions 102, the second microelectronic device structure assembly 218 of the microelectronic device 101 may be configured to include a desired arrangement of sense amplifier (SA) sections 240 (e.g., odd SA sections 240A and even SA sections 240B) and sub-word line driver (SWD) sections 242 (e.g., odd SWD sections 242A and even SWD sections 242B). The SA sections 240 and SWD sections 242 of the second microelectronic device structure assembly 218 vertically overlie (e.g., in the Z-direction) the first microelectronic device structure assembly 156.

The SWD sections 242 of the second microelectronic device structure assembly 218 are positioned within horizontal areas of the word line exit regions 106 of the microelectronic device 101. As depicted in FIG. 1, odd SWD sections 242A of the second microelectronic device structure assembly 218 may be positioned with horizontal boundaries of odd word line exit regions 106A of the microelectronic device 101. One such odd word line exit region 106A may, for example, be horizontally interposed between the first array region 102A and the third array region 102C. Within the first microelectronic device structure assembly 156 of the microelectronic device 101, odd word lines 120A may horizontally extend (e.g., in the X-direction) through the first array region 102A into the odd word line exit region 106A. Termination points of such odd word lines 120A may be within a horizontal area of the odd SWD section 242A of the second microelectronic device structure assembly 218. In addition, conductive structures (e.g., conductive contacts, conductive routing, conductive pads) coupling the odd word lines 120A to sub-word line drivers within the odd SWD section 242A may be confined within the horizontal boundaries of the odd SWD section 242A. As also depicted in FIG. 1, even SWD section 242B of the second microelectronic device structure assembly 218 may be positioned with horizontal boundaries of an even word line exit region 106B of the microelectronic device 101. One such even word line exit region 106B may, for example, at a side of the first array region 102A opposite that adjacent to one of the odd word line exit regions 106A. Within the first microelectronic device structure assembly 156 of the microelectronic device 101, even word lines 120B may horizontally extend (e.g., in the X-direction) through the first array region 102A into the even word line exit region 106B. The odd word line exit regions 106A may be referred to as located at a first lateral feature of, e.g., the first array region 102A, and the even word line exit regions 106B may be referred to a located at a second lateral feature of, e.g., the first array region 102A, where the second word line exit regions are across from and opposite and odd word line exit regions 106A. Termination points of such even word lines 120B may be within a horizontal area of the even SWD section 242B of the second microelectronic device structure assembly 218. In addition, conductive structures (e.g., conductive contacts, conductive routing, conductive pads) coupling the even word lines 120B to sub-word line drivers within the even SWD section 242B may be confined within the horizontal area the even SWD section 242B.

The SA sections 240 of the second microelectronic device structure assembly 218 may be positioned at least partially within horizontal areas of the array regions 102 of the microelectronic device 101. Within a horizontal area of an individual array region 102 (e.g., the first array region 102A, the second array region 102B, the third array region 102C, or the fourth array region 102D), a pair of the SA sections 240 may include a first SA section 240A and a second SA section 240B. For an individual array region 102 (e.g., the third array region 102C), the first SA section 240A and the second SA section 240B may be positioned above and at or proximate opposite corners (e.g., diagonally opposite corners, or "kitty corner") of the array region 102 than one another. For example, as shown in FIG. 1, for an individual array region 102C, the first SA section 240A may be positioned at or proximate a first corner 246A of the array region 102C. In some embodiments, the first SA section 240A is horizontally (X-direction) offset from the first corner 246A by a portion of one of the SWD sections 242, such as one of the odd SWD sections 242A. The odd SWD section 242A may, for example, horizontally extend partially into the array region 102 (e.g., the third array region 102C). In addition, as also shown in FIG. 1, for an individual array region 102 (e.g., the third array region 102C), the second SA section 240B may be positioned at or proximate a fourth corner 246D of the array region 102 kitty corner to the first corner 246A of the array region 102. In some embodiments, the second SA section 240B is horizontally offset from the fourth corner 246D by a portion of another one of the SWD sections 242, such as one of the even SWD sections 242B. The even SWD section 242B may, for example, horizontally extend partially into the array region 102 (e.g., the third array region 102C). A second corner 246B and a third corner 246C are also given in addition to the first corner 246A and the fourth corner 246D, for useful reference within, e.g., the third array region 102C.

In some embodiments, pairs of the SA sections 240 (e.g., the first SA section 240A and the second SA section 240B) may be located relatively more centrally, in the X-direction, within an individual array region 102 than may otherwise be the case if the SWD sections 242 were not positioned within the word line exit regions 106. For example, given the positions and horizontal dimensions of the SWD sections 242, the SA sections 240 may be horizontally offset in the X-direction from lateral boundaries of the array regions 102 to provide desirable spacing between the SWD sections 242 and the SA sections 240. In addition, although the SA sections 240 are illustrated as being provided in kitty-corner positions within individual array regions 102 in FIG. 1, the SA sections 240 may be even more centrally positioned, including centrally positioned in the X-direction, within individual array regions 102.

In addition, while FIG. 1 depicts horizontal areas of the SA sections 240 as being substantially confined within horizontal areas of the array regions 102, the disclosure is not so limited. In additional embodiments, the SA sections 240 are at least partially positioned outside of the horizontal areas of the array regions 102, such as at least partially within horizontal areas of the DL exit regions 104. For example, the SA sections 240 may horizontally overlap the arrays regions 102 and the DL exit regions 104. As another example, the SA sections 240 may only horizontally overlap the DL exit regions 104, such that the SA sections 240 are substantially confined with horizontal areas of the DL exit regions 104.

In an embodiment, a base semiconductor structure 110 is the only semiconductor material in the first microelectronic device structure assembly 156, such that an open architecture may allow several variations of arranging odd word lines 120A (FIG. 1) enumerated, e.g., 1, 3, 5, 7 . . . (n+1), and even word lines 120B (FIG. 1), enumerated e.g., 0, 2, 4, 6 . . . n, where odd word lines 120A (FIG. 1), emerge from two horizontally neighboring array regions 102 (FIG. 1), at an odd word line exit region 106A (FIG. 1), and similarly where even word lines 120B (FIG. 1), emerge from two other horizontally neighboring array regions 102 (FIG. 1), at an even word line exit region 106B (FIG. 1). As illustrated, access devices 116 (FIG. 1A, e.g., access transistors) may be located within the array region 102 (FIGS. 1A and 1B). In addition, digit lines 118 (FIGS. 2A and 2B, e.g., data lines, bit lines) may be located to be coupled to the access devices 116 (FIG. 2A) and to horizontally extend in the Y-direction through the array region 102 (FIG. 2A). At least some of the digit lines 118 (FIGS. 2A and 2B) may terminate (e.g., end) within the digit line exit regions 104 (FIG. 2B). Furthermore, word lines 120 (e.g., access lines) may be configured to be coupled to the access devices 116 (FIGS. 2A and 2B) and to horizontally extend in the X-direction through the array region 102 (FIG. 2A). At least some of the word lines 120 (FIGS. 2A through 2C) may terminate within the word line exit regions 106 (FIG. 2C).

The access devices 116 located within the array region 102 may be employed as components of memory cells (e.g., DRAM cells) located within the array region 102. By way of non-limiting example, each access device 116 may individually include a channel region comprising a portion of the base semiconductor structure 110; a source region and a drain region each individually comprising one or more of at least one conductively doped portion of the base semiconductor structure 110 and/or at least one conductive structure formed in, on, or over the base semiconductor structure 110; and at least one gate structure comprising a portion of at least one of the word lines 120. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extending in parallel in the X-direction orthogonal to the Y-direction. As used herein, the term "parallel" means substantially parallel. The digit lines 118 and the word lines 120 may each individually include conductive material. By way of non-limiting example, the digit lines 118 and the word lines 120 may each individually include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 each individually include one or more of W, Ru, Mo, and titanium nitride ($TiN_y$). Each of the digit lines 118 and each of the word lines 120 may individually be substantially homogeneous, or one or more of the digit lines 118 and/or one or more of the word lines 120 may individually be substantially heterogeneous. In some embodiments, each of the digit lines 118 and each of the word lines 120 are configured to be substantially homogeneous.

Within the array region 102, additional features (e.g., structures, materials) are also located on, over, and/or between the access devices 116, the digit lines 118, and the word lines 120. For example, as shown in FIG. 1A, first contact structures 122 (e.g., digit line contact structures, also referred to as so-called "bitcon" structures) may be configured to vertically extend between and couple the access devices 116 to the digit lines 118; second contact structures 124 (e.g., cell contact structures, also referred to as so-called "cellcon" structures) may be configured in contact with the access devices 116 and may configured and positioned to couple the access devices 116 to subsequently formed storage node devices (e.g., capacitors); dielectric cap structures 126 may be configured on or over the digit lines 118; and additional dielectric cap structures 128 may be configured on or over the word lines 120. In addition, dielectric structures (e.g., dielectric spacers, such as low-k dielectric spacers formed of and including one or more low-k dielectric materials) may be configured to intervene (e.g., horizontally intervene) between and isolate the second contact structures 124 and digit lines 118; and further dielectric structures (e.g., gate dielectric structures, such as gate dielectric oxide structures) may be configured to intervene (e.g., horizontally intervene) between and isolate the first contact structures 122 and the word lines 120.

The first contact structures 122 and the second contact structures 124 may individually include at least one conductive material. In some embodiments, the first contact structures 122 and the second contact structures 124 individually include one or more of at least one metal (e.g., W), at least one alloy, at least one conductive metal silicide (e.g., one or more of titanium silicide ($TiSi_x$), cobalt silicide (CoSi$_x$), tungsten silicide (WSi$_x$), tantalum silicide (TaSi$_x$), molybdenum silicide (MoSi$_x$), and nickel silicide (NiSi$_x$)), and at least one conductive metal nitride (e.g., one or more of TiN$_y$, tungsten nitride (WN$_y$), tantalum nitride (TaN$_y$), cobalt nitride (CoN$_y$), molybdenum nitride (MoN$_y$), and nickel nitride (NiN$_y$)). In addition, the dielectric cap structures 126 and the additional dielectric cap structures 128 may individually include at least one insulative material. In some embodiments, the dielectric cap structures 126 and the additional dielectric cap structures 128 are individually formed of and include a dielectric nitride material (e.g., SiN$_y$, such as Si$_3$N$_4$).

As shown in FIG. 2A, within the array region 102 at least one first routing tier 134 including first routing structures 136 may be located over the access devices 116; and storage node devices 138 (e.g., capacitors) may be located over and in electrical communication with at least some of the first routing structures 136; and a second routing tier 142 including second routing structures 144 may be located over the storage node devices 138.

The first routing structures 136 of the first routing tier 134 may be employed to facilitate electrical communication between additional features (e.g., structures, materials, devices) coupled thereto. In some embodiments, at least some of the first routing structures 136 couple the access devices 116 to the storage node devices 138 to form the memory cells 146. The first routing structures 136 may serve as redistribution structures to operatively connect an array of the access devices 116 having a first layout configuration to an array of the storage node devices 138 having a second, different layout configuration. The first routing structures 136 may each individually include conductive material. By way of non-limiting example, the first routing structures 136 may include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 136 are formed of and include W.

Referring next to FIG. 2B, within the digit line exit regions 104, at least some of the digit lines 118 horizontally extending, in the Y-direction, through the array regions 102 may horizontally terminate (e.g., end) in the Y-direction. A portion of one of the array regions 102, the first array region 102A, is illustrated to show the continuity of one of the digit lines 118 from one of array regions 102 into one of the digit line exit region 104. Each of the digit lines 118 horizontally extending through the array region 102 (FIG. 1A) and horizontally terminating within the digit line exit region 104, may be configured to terminate at substantially the same horizontal position in the Y-direction; or at least one of the digit lines 118 horizontally terminating within the digit line exit region 104 may be formed to terminate at a different horizontal position in the Y-direction within the digit line exit region 104 than at least one other of the digit lines 118 horizontally terminating within the digit line exit region 104. In some embodiments, at least some digit lines 118 horizontally neighboring one another in the X-direction, have terminal ends (e.g., terminal surfaces) horizontally offset from one another in the Y-direction. Horizontally offsetting the terminal ends of some of the digit lines 118 from the terminal ends of some other of the digit lines 118 within the digit line exit region 104 may, for example, promote or facilitate desirable contact structure arrangements within the digit line exit regions 104.

Still referring to FIG. 2B within the first microelectronic device structure assembly 156, interconnection of the digit lines 118 to the sense amplifiers 240, includes first digit line interconnects 298D. The first digit line interconnects 298D may also be referred to as a first "vertical digit line contacts" (VDLCON) 298D. The vertical digit line contact 298D may contact (e.g., physically contact, electrically contact) portions of the second routing structures 144 within horizontal areas of the digit line exit regions 104. In an embodiment, the first digit line interconnects 298D are individually substantially monolithic (e.g., unitary) and vertically extend (e.g., in the Z-direction) at least between the digit lines 118 and the second routing tier 142. In an embodiment, one or more of the first digit line interconnects 298D vertically extend into the digit lines 118. In an embodiment, a vertical height of the first digit line interconnects 298D is greater that a combined vertical height of the first routing structures 136 and the storage node devices 138. Further interconnection of the digit lines 118 to the sense amplifiers 240, within the digit line exit regions 104, includes an interface contact pad 301 within the first microelectronic device structure assembly 156 that may directly couple to lateral interconnects 199 that are within the second microelectronic device structure assembly 218. The lateral interconnects 199 (e.g., horizontal conductive routing structures) extend transversely from and out of the digit line exit regions 104, and to the sense amplifiers 240, where the sense amplifiers 240 are vertically above (Z-direction) memory cells 146 (FIG. 2A) within the array regions 102 of the first microelectronic device structure assembly 156.

Still referring to FIG. 2B, a lateral interconnect 199 horizontally extending between and coupled to the digit line 118 and the several interconnect elements 289D, and 301 (and hence, the digit lines 118) are coupled to control logic circuitry within the CMOS device structure 218, including but not limited to sense amplifier circuitry (e.g., including some of the control logic devices 191) within the SA sections 240. As shown in FIG. 2B, the lateral interconnects 199 may vertically overlie the memory cells 146, and may horizontally extend (e.g., in the Y-direction) from the digit line exit regions 104 and into the SA sections 240 within the array regions 102 of the microelectronic device 101.

As shown in FIG. 2B, within the second microelectronic device structure assembly 218, an additional routing tier 196 may be present, and may include additional routing structures 198. At least some of the additional routing structures 198 may be configured and positioned as coupling features (e.g., structures, devices) of the microelectronic device to back-end-of-line (BEOL) contact structures 202 vertically thereover. The BEOL contact structures 202 and the additional routing structures 198, for example, couple external circuitry (e.g., global circuitry) of a relatively larger device including the microelectronic device to internal circuitry (e.g., local circuitry) of the microelectronic device 101. In an embodiment, local circuitry within the control logic devices 191 is sufficient to not require global circuitry, by virtue of the SWD being located over and at least partially confined within horizontal boundaries of the word line exit regions 106.

Within the digit line exit region 104, dummy word lines 121 may, optionally, be located vertically below the digit lines 118. If so located, the dummy word lines 121 may be located at substantially the same vertical position (e.g., vertical elevation) within the microelectronic device 101 (e.g., within the base semiconductor structure 110 thereof) as the word lines 120, and may be located to horizontally extend orthogonal to the digit lines 118 (e.g., in the X-direction). A material composition of the dummy word lines 121 may be substantially the same as a material composition of the word lines 120. The dummy word lines 121 may be electrically isolated from one another and the other components (e.g., the word lines 120, the digit lines 118) of the microelectronic device 101. The dummy word lines 121 (if any) within the digit line exit region 104 may not be part of data paths during use and operation of the microelectronic device 101 of the disclosure. In additional embodiments, the dummy word lines 121 are absent (e.g., omitted) from the digit line exit region 104.

Referring next to FIG. 2C, within the word line exit regions 106 at least some of the word lines 120 horizontally extending, in the X-direction, through the array regions 102 may horizontally terminate (e.g., end) in the X-direction. Portions of two of the array regions 102, the first array region 102A and the third array region 102C, are illustrated to show the continuity of one of the word lines 120 from one of the array regions 102 into one of the word line exit regions 106. As shown in FIG. 2C, one of the SWD sections 242 of the second microelectronic device structure assembly 218 is positioned above the word line exit region 106 and vertically overlies the memory cells 146 within the array regions 102. The SWD section 242 may also horizontally overlap the array regions 102 (e.g., the first array region 102A and the third array region 102C) horizontally adjacent thereto.

As shown in FIG. 2C, sub-word line drivers of the SWD sections 242 and conductive structures coupling the word lines 120 to the sub-word line drivers of the SWD sections 242 are substantially confined within horizontal boundaries of word line exit regions 106. Such confinement may reduce timing delays within the microelectronic device 101 by shortening the length of signal paths relative to conventional configurations. In an embodiment, within an individual word line exit region 106, a first redistribution structure pad (K0) 297 is coupled to an individual word line 120 by a first sub contact 295, and the first redistribution structure (K0) 297 is coupled to a second redistribution structure 299 (K1) by a first word line interconnect 298W. The first word line interconnect 298W may also be referred to as a first "vertical word line contact" (VWLCON) 298W. The first redistribution structure 299 (K1) may be located within the second routing tier 142. In addition, a second contact pad (K2) 301 may vertically overlie and be coupled to the second redistribution structure 299. The second contact pad (K2) 301 may also be coupled to sub-word line driver circuitry with the SWD section 242. The second contact pad (K2) 301 is positioned at an interface of the isolation structure 234 formed from an isolation material 164 of the first microelectronic device structure assembly 156 and the second microelectronic device structure assembly 218; and the second contact pad (K2) 301 in the first microelectronic device structure assembly 156, is bonded to a third contact pad 303 (K3) in the second microelectronic device structure assembly 218. The second contact pad 301 (K3) may also be referred to as a "top external contact pad 301" (K2) (or top contact pad 301) as the top contact pad 301 (K2) is at the upper boundary of the first microelectronic device structure assembly 156, and the top contact pad 301 is registered, mated and bonded with the third contact pad 303 (K3). Similarly, the third contact pad 303 (K3) may also be referred to as a "bottom external contact pad 303" (K3) (or bottom contact pad 303) as the bottom external contact pad 303 (K3) is at the lower boundary of the second microelectronic device structure assembly 218 (when inverted), and the bottom external contact pad 303 (K3) is registered, mated and bonded with the upper external contact pad 301 (K2). The routing structures that include the second contact pad 301 in the first microelectronic device structure assembly 156, and the third contact pad 303 in the CMOS device structure that is the second microelectronic device structure assembly 218, may be exhibited as a composite stripe that runs orthogonal to the plane depicted in FIG. 2C. Consequently, the routing structures 301 and 303 facilitate electrical connection between a given word line 120 terminating within a given word line exit region 106 and a sub-word line driver within a given SWD section 242 with horizontal boundaries of the word line exit region 106. Similarly and consequently between the word line 120 and the sub word line driver section 242, the interconnect structures that vertically extend therebetween are confined within the horizontal boundaries of the word line exit region 106. In particular, the following interconnect structures are confined within the horizontal boundaries of the word line exit region 106: the first redistribution structure 297 (K0), the vertical word line contact 298W, the second redistribution structure 299 and the second contact pad (K2) 301 and other contacts or subcontacts that directly contact the enumerated interconnect structures. Similarly, the second contact pad (K2) 301 in the first microelectronic device structure assembly 156, is bonded to the third contact pad 303 (K3) in the second microelectronic device structure assembly 218, and the third contact pad 303 (K3), although it is not in the first microelectronic device structure assembly 156, is confined within the horizontal boundaries of the word line exit region 106.

Still referring to FIG. 2C, electrical communication between the word lines 120 and sub-word line driver circuitry within the SWD sections 242 is further accomplished by sub word line driver contacts 305 that couples the sub-word line driver circuitry to the bottom contact pad 303 (K3). In addition, within the SWD sections 242 of the second microelectronic device structure assembly 218, further contacts 398 may couple the sub-word line driver circuitry in the SWD sections 242, to still further contact structures 402, for BEOL metallization, such as BEOL metallization-1 (BEOL M1) to facilitate electrical communication between the microelectronic device 101 and circuitry of a relatively larger device including the microelectronic device 101. In an embodiment, the first word line interconnect 298W is configured with a monolithic (single material, homogeneous characteristic electrically conductive) length (Z-direction) that extends at least between the combined height (Z-direction) of the digit lines 118, the first routing structures 136, and the storage node devices 138. In an embodiment, the digit line interconnect 298D (FIG. 2B) and the word line interconnect 298W have substantially the same length (Z-direction). In an embodiment, word line interconnect 298W has a greater length (Z-direction) than that of the digit line interconnect 298D (FIG. 2B).

As previously mentioned, FIG. 2D is a simplified plan view of a portion of the microelectronic device 101 including one of the SWD sections 242. FIG. 2D illustrates some of the word lines 120 of the microelectronic device 101 with the boundaries of one of the word line exit regions 106, and the associated SWD section 242 within horizontal boundaries of the word line exit region 106, between two of the two array regions 102 of the microelectronic device 101. The SWD section 242 may be one of the odd SWD sections 242A depicted FIG. 1. In some embodiments, the SWD section 242 (e.g., odd SWD section 242A) only horizontally extends (e.g., in the X-direction) across a portion (e.g., less than an entirety) of the word line exit region 106 (e.g., odd word line exit region 106A), as depicted by the dashed line indicated by the reference line 242AX shown in FIG. 2D. In additional embodiments, the SWD section 242 (e.g., odd SWD section 242A) horizontally extends (e.g., in the X-direction) across and beyond the word line exit region 106 (e.g., odd word line exit region 106A), as depicted by the dashed line indicated by the reference line 242A shown in FIG. 2D. In such embodiments, the SWD section 242 partially horizontally overlaps portions of the array regions 102 (e.g., the first array region 102A and the third array region 102C) horizontally neighboring the word line exit region 106. In an embodiment, the SWD sections 242 individually horizontally overlap portions of the array regions 102 most horizontally proximate thereof, but the SWD sections 242 do not horizontally extend past dummy digit lines 118D (e.g., inactive digit lines) within the array region 102. The inactive (or dummy) digit lines 118D, are depicted adjacent live (electrically active) digit lines 118, (whether odd digit lines 118A or even digit lines 118B).

In FIG. 2D, for ease of understanding the drawings and associated description, only odd word lines 120A of the word lines 120 horizontally extending through the odd word line exit region 106A are depicted. This is because, within the odd word line exit region 106A, only the odd word lines 120A electrically connect to the sub-word line driver circuitry of the odd SWD section 242A vertically overlying and within horizontal boundaries of the odd word line exit region 106A. However, it will be understood that even word lines 120B (FIG. 1) will also be present within the odd word line exit region 106A, and will horizontally alternate with the odd word lines 120A. In addition, while in FIG. 2D all of the word lines 120 are depicted as extending completely through the odd word line exit region 106A, some word lines 120 (e.g., some odd word lines 120A, some even word lines 120B (FIG. 1)) may terminate within the odd word line exit region 106A. Such termination may, for example, be employed to provide more space for the contacts (e.g., the first sub contact 295) and the redistribution structures (e.g., first redistribution structure (K0) 297) operatively associated with at least some of the odd word lines 120A within the odd word line exit region 106A. For example, in some embodiments, even word lines 120B (FIG. 1) horizontally neighboring the odd word lines 120A upon which the first sub contacts 295 physically land may terminate within odd word line exit region 106A at located horizontally offset from the first sub contacts 295. In addition, not all of the odd word lines 120A horizontally extending through the odd word line exit region 106A may be coupled to sub-word line driver circuitry of the odd SWD section 242A vertically overlying and within horizontal boundaries of the odd word line exit region 106A. The even word line exit regions 106B (FIG. 1) may be similarly configured, but with the configurations and functions of the even word lines 120B (FIG. 1) and the odd word lines 120A reversed relative to that described above with reference to FIG. 2D for the odd word line exit regions 106A.

Referring next to FIG. 3, depicted is a simplified plan view of a microelectronic device 201, in accordance with additional embodiments of the disclosure. The microelectronic device 201 includes a first microelectronic device structure assembly similarly constructed to the first microelectronic device structure assembly 156 previously described with reference to FIGS. 1 and 2A through 2D; and a second microelectronic device structure assembly similarly constructed to the second microelectronic device structure assembly 218 previously described with reference to FIGS. 1 and 2A through 2D. Unless described otherwise below, features (e.g., structures, materials, regions, devices) previously described with reference to one or more of FIGS. 1 and 2A through 2D for the microelectronic device 101 may be considered to be present in substantially the same manner within the microelectronic device 201. Accordingly, in FIG. 3, unless described otherwise below, features designated with a reference numeral the same that of feature previously described with reference to one or more of FIGS. 1 and 2A through 2D will be understood to be substantially similar to the previously described feature. In addition, for clarity and use of understanding the embodiment depicted in FIG. 3, not all features previously described in relation to the microelectronic device 101 (FIGS. 1 and 2A through 2D) are illustrated in FIG. 3. However, unless described otherwise below, features previously described in relation to the microelectronic device 101 (FIGS. 1 and 2A through 2D) may be considered to present in a substantially similar manner within the microelectronic device 201.

As shown in FIG. 3, in contrast to the microelectronic device 101 (FIGS. 1 and 2A through 2D), within the microelectronic device 201 the SWD sections 242 are split between odd SWD sections 242A and even SWD sections 242B, along lateral boundaries of individual array regions 102. For example, an individual word line exit region 106 between the first array region 102A and the third array region 102C may be divided to include an odd word line exit sub-region 106A and an even word line exit sub-region 106B within horizontal boundaries in the Y-direction of the first array region 102A and the third array region 102C; and an odd SWD section 242A may be positioned vertically above and within a horizontal area of the odd word line exit sub-region 106A, and an even SWD section 242B may be positioned vertically above and within a horizontal area of the even word line exit sub-region 106B. A group of the odd word lines 120A horizontally extending through the first array region 102A may be coupled to sub-word line driver circuitry of the odd SWD section 242A, and a group of even word lines 120B horizontally extending through the first array region 102A may be coupled to sub-word line driver circuitry of the even SWD section 242B. As shown in FIG. 3, arrangements of the odd word line exit sub-regions 106A and the even word line exit sub-regions 106B, and, hence, arrangements of the odd SWD sections 242A and the even SWD sections 242B may be reversed along opposing sides on an individual array region 102 (e.g., the first array region 102). In any event, interconnections between portions of word lines 120 within the word line exit regions 106 and sub-word line driver circuitry of SWD sections 242 within horizontal areas of the word line exit regions 106, is facilitated by conductive routing structures (e.g., the structures 295, 297, 298W, 299, 301 and other contacting structures previously described with reference to FIG. 2C) substantially confined within the horizontal areas of the word line exit regions 106.

In some embodiments, the odd SWD sections 242A and even SWD sections 242B are substantially confined within horizontal areas of the odd word line exit sub-regions 106A and the even word line exit sub-regions 106B, as depicted by way of dashed lines in FIG. 3. In additional embodiments, the odd SWD sections 242A and even SWD sections 242B horizontally extend into the array regions 102 horizontally neighboring the odd word line exit sub-regions 106A and the even word line exit sub-regions 106B. For example, the odd SWD sections 242A and even SWD sections 242B may be configured as the odd SWD sections 242AX and even SWD sections 242BX depicted in FIG. 3 by way of additional dashed lines. As shown in FIG. 3, majorities of the odd SWD sections 242AX and even SWD sections 242BX may be positioned within the odd word line exit sub-regions 106A and the even word line exit sub-regions 106B, respectively, but the odd SWD sections 242AX and even SWD sections 242BX may also horizontally extend into the array region s 102 horizontally neighboring (e.g., horizontally flanking) the odd word line exit sub-regions 106A and the even word line exit sub-regions 106B. Put another way, the odd word line exit regions 106A in FIG. 3 may be referred to as located at a first sub-region lateral feature of, e.g., the first array region 102A and vertically (Z-direction) below corresponding odd SWD sections 242A, and the even word line exit regions 106B in FIG. 3 may be referred to as co-located at the first lateral feature of, e.g., the first array region 102A and the even word line exit regions 106B are vertically (Z-direction) below and corresponding to even SWD sections 242B.

Figure 4:
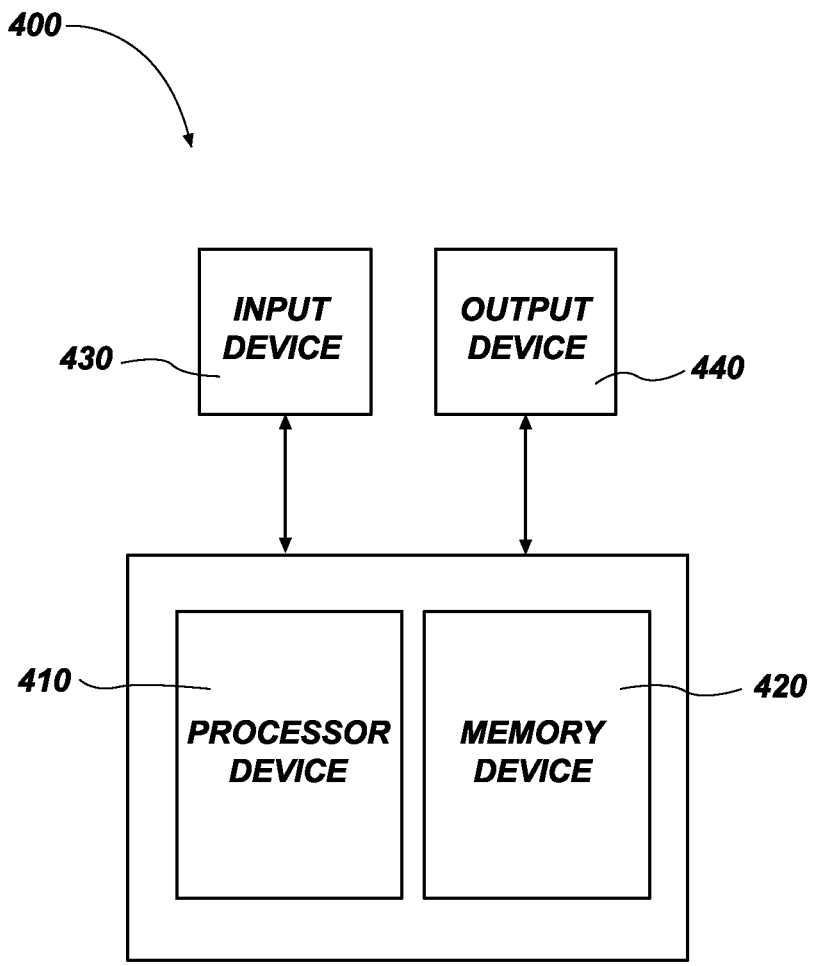
FIG. 4 is a block diagram of an electronic system, according to embodiments of the disclosure.

Microelectronic devices (e.g., the microelectronic device 101, the microelectronic device 201) of the disclosure may be used in embodiments of electronic systems of the disclosure. For example, FIG. 4 is a block diagram of an electronic system 400, according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 400 includes at least one memory device 420. The memory device 420 may include, for example, one or more of the microelectronic devices (e.g., the microelectronic device 101, the microelectronic device 201) of the disclosure. The electronic system 400 may further include at least one electronic signal processor device 410 (often referred to as a "microprocessor") that is part of an integrated circuit. The electronic signal processor device 410 may include, for example, one or more of microelectronic device structures (e.g., the microelectronic device 101, the microelectronic device 201) of the disclosure. While the memory device 420 and the electronic signal processor device 410 are depicted as two (2) separate devices in FIG. 4, in additional embodiments, a single (e.g., only one) memory/processor device having the functionalities of the memory device 420 and the electronic signal processor device 410 is included in the electronic system 400. In such embodiments, the memory/processor device may include, for example, one or more of the microelectronic devices=(e.g., the microelectronic device 101 and the microelectronic device 201) of the disclosure. The electronic signal processor device 410 and the memory device 420 may be part of a disaggregated-die assembly.

The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, and/or a speaker. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Thus, disclosed is a microelectronic device, comprising array regions individually comprising: memory cells comprising access devices and storage node devices; digit lines coupled to the access devices and extending in a first direction; and word lines coupled to the access devices and extending in a second direction orthogonal to the first direction. The sub word line exit regions are horizontally alternating with the array regions in the second direction; and sub word line driver sections are overlapping and above, and in electrical communication with the sub word line exit regions, where electrical communication between word lines in the sub word line exit regions and the sub word line driver sections is laterally bounded within socket regions delineated by the sub word line exit regions.

Also disclosed is a microelectronic device, comprising array regions in a first microelectronic device structure assembly individually comprising memory cells comprising access devices and storage node devices; digit lines coupled to the access devices and extending in a first direction; and word lines coupled to the access devices and extending in a second direction orthogonal to the first direction; word line exit regions horizontally alternating with the array regions in the second direction; and sub word line driver sections in a second microelectronic device structure assembly, the sub word line exit regions overlapping and above, and in electrical communication with the word line exit regions; the first microelectronic device structure assembly and the second microelectronic device structure assembly being face-to-face mated at an isolation structure. The electrical communication between word lines in the word line exit regions and the sub word line driver sections is laterally bounded within socket regions delineated by the word line exit regions, and the electrical communication comprises a vertical word line contact in the sub word line exit region; the vertical word line contact contacting a zeroth redistribution structure pad at one end and a first redistribution structure pad at another end; the first redistribution structure pad is coupled to a second redistribution structure pad; and the second redistribution structure pad layer is coupled to a third redistribution structure pad, the second redistribution structure pad layer is coupled to a third redistribution structure pad being mated at the isolation structure.

Also disclosed is an electronic system, comprising an input device; an output device; a processor device operably coupled to the input device and the output device; and a memory device operably coupled to the processor device and comprising at least one microelectronic device structure comprising: array regions individually comprising: memory cells comprising access devices and storage node devices; digit lines coupled to the access devices and extending in a first direction; and word lines coupled to the access devices and extending in a second direction orthogonal to the first direction; word line exit regions horizontally alternating with the array regions in the second direction; and sub word line driver sections overlapping and above, and in electrical communication with the word line exit regions, wherein electrical communication between word lines in the word line exit regions; and the sub word line driver sections is laterally bounded within socket regions delineated by the word line exit regions.

The structures, devices, system, and methods of the disclosure advantageously facilitate one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
   array regions individually comprising:
      memory cells comprising access devices and storage node devices;
      digit lines coupled to the access devices and extending in a first direction; and
      word lines coupled to the access devices and extending in a second direction orthogonal to the first direction;
   word line exit regions horizontally alternating with the array regions in the second direction; and
   sub word line driver sections vertically overlying and horizontally overlapping the word line exit regions, the sub word line driver sections including sub word line driver circuitry in electrical communication with the word lines by way of routing structures substantially confined within horizontal boundaries of the word line exit regions.

2. The microelectronic device of claim 1, wherein the sub word line driver sections are substantially confined within the horizontal boundaries of the word line exit regions.

3. The microelectronic device of claim 1, wherein one or more of the sub word line driver sections horizontally extend into horizontal areas of one or more of the array regions most horizontally proximate thereto.

4. The microelectronic device of claim 1, wherein some of the digit lines within the array regions are configured to be electrically inactive and are horizontally interposed between the sub word line driver sections and some other of the digit lines within the array regions that are configured to be electrically active.

5. The microelectronic device of claim 1, wherein the word line exit regions include odd word line exit regions at a first lateral feature of the array regions and even word line exit regions at a second lateral feature of the array regions that is across from and opposite the odd word line exit regions.

6. The microelectronic device of claim 5, wherein the word line exit regions are split between odd word line exit regions and even word line exit regions, and wherein the odd word line exit regions are at a first sub-region lateral feature the array regions and vertically below odd sub word line driver sections, and wherein the even word line exit regions are at the first lateral feature of the array regions, and the even word line exit regions are vertically below even sub word line driver sections.

7. The microelectronic device of claim 5, wherein the sub word line driver sections are substantially confined within the horizontal boundaries of the word line exit regions.

8. The microelectronic device of claim 1, wherein the sub word line driver circuitry comprises complementary metal-oxide-semiconductor (CMOS) circuitry.

9. The microelectronic device of claim 1, further comprising interconnect structures vertically extending between portions of the word lines within word line exit regions and the sub word line driver circuitry within the word line exit regions, the interconnect structures confined within horizontal boundaries of the word line exit regions.

10. The microelectronic device of claim 9, wherein interconnect structures comprise:
   first conductive contacts on the portions of the word lines within the word line exit regions;
   first conductive contact pads on the first conductive contacts;
   second conductive contacts on the first conductive contact pads;
   second conductive contact pads on the second conductive contacts; and
   third conductive contacts on the second conductive contact pads and coupled to the sub word line driver circuitry.

11. The microelectronic device of claim 10, wherein the first conductive contacts, the first conductive contact pads, the second conductive contacts, the second conductive contact pads, and the third conductive contacts are each substantially confined within horizontal areas of the sub word line driver sections.

12. The microelectronic device of claim 1, wherein the array regions comprise dynamic random-access memory (DRAM) cells, each of the DRAM cells including an access device and a capacitor vertically over and coupled to the access device.

13. The microelectronic device of claim 1, further comprising:
   digit line exit regions horizontally alternating with the array regions in the first direction and individually comprising:
      portions of the digit lines extending beyond the array regions adjacent thereto; and
      digit line contact structures coupled to at least some of the portions of the digit lines.

14. The microelectronic device of claim 13, further comprising sense amplifier circuitry vertically overlying and in electrical communication with the digit line contact structures.

15. The microelectronic device of claim 14, wherein the sense amplifier circuitry comprises CMOS circuitry at least partially positioned within horizontal areas of the array regions.

16. A microelectronic device, comprising:
   array regions in a first microelectronic device structure assembly, the array regions individually comprising:
      memory cells comprising access devices and storage node devices;
      digit lines coupled to the access devices and extending in a first direction; and
      word lines coupled to the access devices and extending in a second direction orthogonal to the first direction;
   word line exit regions horizontally alternating with the array regions in the second direction;
   sub word line driver sections in a second microelectronic device structure assembly vertically overlying the first microelectronic device structure assembly, horizontal areas of the sub word line driver sections horizontally overlapping horizontal boundaries of the word line exit regions; and
   conductive routing structure assemblies substantially confined within the horizontal boundaries of the word line exit regions, the conductive routing structure assemblies vertically extending from portions of the word lines extending into the word line exit regions to sub word line driver circuitry within the sub word line driver sections.

17. The microelectronic device of claim 16, further comprising:
    digit line exit regions horizontally alternating with the array regions in the first direction;
    sense amplifier sections in the second microelectronic device structure assembly vertically overlying the first microelectronic device structure assembly; and
    conductive routing extending from portions of the digit lines extending into the digit line exit regions to sense amplifier circuitry within the sense amplifier sections.

18. The microelectronic device of claim 17, wherein horizontal areas of the sense amplifier sections at least partially horizontally overlap horizontal areas of the array regions.

19. The microelectronic device of claim 16, wherein at least one of the conductive routing structure assemblies comprises:
    a first contact on one of the word lines within the word line exit regions;
    a first contact pad on the first contact;
    a second contact on the first contact pad;
    a second contact pad on the second contact; and
    a third contact on the second contact pad and coupled to the sub word line driver circuitry.

20. The microelectronic device of claim 16, wherein the horizontal areas of the sub word line driver sections are substantially confined within the horizontal boundaries of the word line exit regions.

21. The microelectronic device of claim 16, wherein portions of the horizontal areas of the sub word line driver sections horizontally extend beyond the horizontal boundaries of the word line exit regions and into horizontal areas of the array regions.

22. An electronic system, comprising:
    an input device;
    an output device;
    a processor device operably coupled to the input device and the output device; and
    a memory device operably coupled to the processor device and comprising at least one microelectronic device structure comprising:
        array regions individually comprising:
            memory cells comprising access devices and storage node devices;
            digit lines coupled to the access devices and extending in a first direction; and
            word lines coupled to the access devices and extending in a second direction orthogonal to the first direction;
        word line exit regions horizontally alternating with the array regions in the second direction, portions of the word lines extending into the word line exit regions;
        sub word line driver sections substantially within horizontal boundaries of the word line exit regions and comprising sub word line driver circuitry, the sub word line driver circuitry vertically above the word line exit regions; and
        conductive routing structures confined within horizontal boundaries of the word line exit regions and coupling at least some of the word lines to at least some of the sub word line driver circuitry.

23. The electronic system of claim 22, further comprising:
    digit line exit regions horizontally alternating with the array regions in the first direction, portions of the digit lines extending into the digit line exit regions;
    sense amplifier sections at least partially within horizontal areas of the array regions and comprising sense amplifier circuitry, the sense amplifier circuitry vertically overlying the memory cells; and
    additional conductive routing structures coupling at least some of the digit lines to at least some of the sense amplifier circuitry.

24. The electronic system of claim 23, wherein some of the additional conductive routing structures extend beyond horizontal areas of the digit line exit regions.

25. The electronic system of claim 22, wherein the memory device comprises a DRAM device.

* * * * *